United States Patent
Melzer

(10) Patent No.: US 6,931,932 B2
(45) Date of Patent: Aug. 23, 2005

(54) DEVICE FOR MEASURING THE AMPLITUDE OF THE TIP OF AN OSCILLATING CAPILLARY

(75) Inventor: Martin Melzer, Steinhausen (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/742,176

(22) Filed: Dec. 19, 2003

(65) Prior Publication Data

US 2004/0149038 A1 Aug. 5, 2004

(30) Foreign Application Priority Data

Dec. 20, 2002 (CH) .................................... 2002 2181/02

(51) Int. Cl.$^7$ ............................ G01N 3/32; G01N 9/18; B23K 31/12
(52) U.S. Cl. .............................. 73/655; 73/579; 228/102
(58) Field of Search ........................ 73/655, 579, 649, 73/1.79; 228/102, 103, 105; 356/622, 621, 615

(56) References Cited

U.S. PATENT DOCUMENTS

| 5,070,483 A | 12/1991 | Berni |
| 5,199,630 A | 4/1993 | Felber et al. |
| 5,431,324 A * | 7/1995 | Kajiwara et al. ............ 228/102 |
| 6,691,574 B2 * | 2/2004 | Hess et al. ..................... 73/579 |
| 6,739,496 B2 * | 5/2004 | Mayer et al. ............. 228/180.5 |
| 6,827,247 B1 * | 12/2004 | Fan et al. ..................... 228/1.1 |
| 2003/0015951 A1 | 1/2003 | Hess et al. |

FOREIGN PATENT DOCUMENTS

| FR | 1086997 | 9/1953 |
| JP | 54030880 | 7/1979 |
| JP | 10209199 | 8/1998 |

\* cited by examiner

Primary Examiner—Hezron Williams
Assistant Examiner—Jacques M. Saint-Surin
(74) Attorney, Agent, or Firm—McCormick, Paulding & Huber LLP

(57) ABSTRACT

A device for measuring the oscillation amplitude of the tip of a capillary by means of a light beam comprises a light source and an opto-receiver and two apertured diaphragms that are arranged between the light source and the opto-receiver and which lie on a common axis. The apertured diaphragms are preferably formed by means of drill holes arranged on a common axis in side walls of a channel formed in a body. The two apertured diaphragms define the diameter of the light beam.

4 Claims, 2 Drawing Sheets

DEVICE FOR MEASURING THE AMPLITUDE OF THE TIP OF AN OSCILLATING CAPILLARY

CROSS REFERENCE TO RELATED APPLICATION

Figure 1:
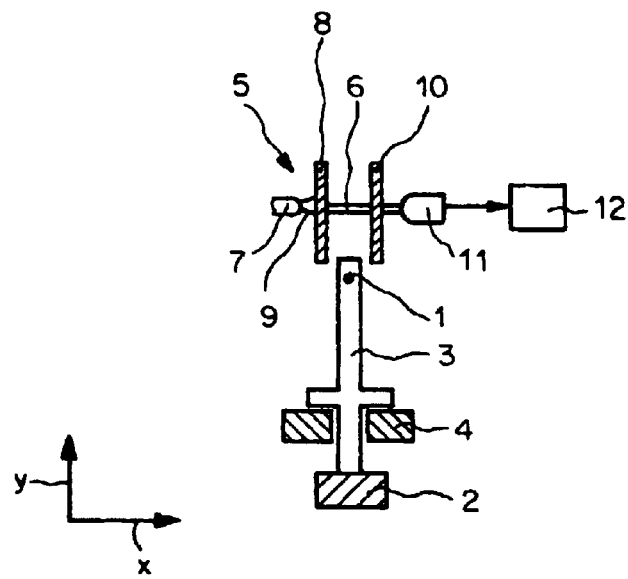

Applicant hereby claims foreign priority under 35 U.S.C. § 119 from Swiss Application No. 2002 2181/02 filed Dec. 20, 2002, the disclosure of which is herein incorporated by reference.

FIELD OF THE INVENTION

The invention concerns a device for measuring the amplitude of a freely oscillating capillary of a Wire Bonder.

BACKGROUND OF THE INVENTION

A Wire Bonder is a machine with which semiconductor chips are wired after mounting on a substrate. The Wire Bonder has a capillary that is clamped to the tip of a horn. The capillary serves to secure the wire to a connection point on the semiconductor chip and to a connection point on the substrate as well as to guide the wire between the two connection points. On producing the wire connection between the connection point on the semiconductor chip and the connection point on the substrate, the end of the wire protruding out of the capillary is first melted into a ball. Afterwards, the wire ball is secured to the connection point on the semiconductor chip by means of pressure and ultrasonics. In doing so, ultrasound is applied to the horn from an ultrasonic transducer. This process is called ball bonding. The wire is then pulled through to the required length, formed into a wire loop and bonded to the connection point on the substrate. This last part of the process is called wedge bonding. After securing the wire to the connection point on the substrate, the wire is torn off and the next bonding cycle can begin.

A method and a device for measuring the amplitude of the freely oscillating capillary are known from the U.S. Pat. No. 5,199,630. The measured value is used for calibrating the ultrasonic transducer. The measurement of the oscillation amplitude of the capillary is done by means of a light barrier.

A method and a device for measuring the amplitude of the freely oscillating capillary with which a laser beam is used for the light barrier are known from the Japanese patent 10-209 199.

Experiments have shown that measurement with the known technique does not provide reproducible results when the amplitude of the tip of the freely oscillating capillary is to be measured.

SUMMARY OF THE INVENTION

The object of the invention is to develop a simple device for measuring the amplitude of the tip of a freely oscillating capillary.

The invention is based on a method and a device for measuring the amplitude of the tip of a freely oscillating capillary in accordance with the U.S. patent application with Ser. No. 10/373,212 filed Feb. 24, 2003 of Peter Hess et al. The method described in this patent application is based on the shading of a light beam by the capillary whereby the oscillations of the capillary modulate the intensity of the let-through light beam. The intensity of the let-through light beam is measured by means of an opto-receiver. Generally, the direction of oscillation of the capillary in the plane is not known. However it is generally the case that the oscillations of the capillary run mainly in the direction of the longitudinal axis of the horn. With the measuring principle of the shading of a light beam only that component of the amplitude of the oscillations of the capillary is measured that runs vertically to the direction of the light beam. The measuring device comprises a light source for production of a light beam with a diameter well defined within a working range of the device. The effective diameter of the light beam in the measuring plane is less than the diameter of the capillary at the site to be measured.

Unfortunately there are numerous undesirable effects such as, for example, contamination of the capillary, diffraction on the capillary, gradual surface variations of the capillary, asymmetries of the light beam, etc, which hamper a reproducible measurement when no special measures are taken. According to the method described in the patent application cited above a plurality of measurements is carried out and the acquired measuring values are averaged. In a first step, the capillary is adjusted in relation to the light beam. Afterwards, the component $A_y$ of the oscillations of the capillary that runs vertically to the direction of the light beam is determined according to the following steps:

a) Placing the capillary at one side of the light beam without it shading the light beam and applying ultrasonics to the horn;

b) Moving the capillary in a given number of n steps along a predetermined direction w into the light beam or completely through the light beam until it is located at the other side of the light beam whereby, with each of the i=1 to n steps, the direct voltage portion $U_{DC}(y_i)$ and the alternating voltage portion $U_{AC}(y_i)$ of the output signal $U_P(y_i)$ of the opto-receiver are determined as well as a co-ordinate $y_i$ whereby the co-ordinate $y_i$ designates the position of the capillary in relation to a co-ordinate axis y running vertically to the light beam and whereby the component $A_y$ to be measured runs in the direction of the co-ordinate axis y;

c) Calculation of sensitivity values $S_i(y_i)$ as a derivation of the direct voltage portion $U_{DC}(y_i)$ with respect to the co-ordinate axis y as $$S_i(y_i) = \frac{dU_{DC}(y_i)}{dy};$$

d) Selection of at least four measuring points and, for each of these at least four measuring points, calculation of a value $A_{y,i}$ as $$A_{y,i} = \frac{U_{AC}(y_i)}{S_i(y_i)};$$

e) Calculation of the component $A_y$ as an average of the values $A_{y,i}$.

Advantageously, the calculation of the component $A_y$ is done by the use of statistical methods. It is of particular advantage to smooth the sensitivity values $S_i(y_i)$ calculated in step c, for example by averaging over neighbouring measuring points. It is also of advantage to smooth the measured values $U_{DC}(y_i)$ and $U_{AC}(y_i)$. It is of further advantage to take into consideration not only four measuring points but as many measuring points as possible. A possible criterion for selection of the measuring points is, for example, that the sensitivity $S_i$ exceeds a predetermined minimum value.

The present invention consists in that two coaxially arranged apertured diaphragms, arranged between the opto-transmitter and the opto-receiver, are used for production of the light beam. In the simplest case therefore, the measuring device in accordance with the invention consists of only three components, namely the opto-transmitter, a body with a channel the two side walls of which each contain a drill hole that lies on a common axis, and the opto-receiver. This axis runs transversally to the longitudinal axis of the channel. Light emitted from the opto-transmitter arrives in the channel through one drill hole and at the opto-receiver through the second drill hole. The two side walls of the channel that have the drill holes form the two coaxially arranged apertured diaphragms. For measurement of the oscillating amplitude of the capillary, the capillary is moved in longitudinal direction of the channel through the light beam defined by the two apertured diaphragms in accordance with the method described above. A conventional light-emitting diode or a laser diode can be used as opto-transmitter. In the area of the drill holes, the side walls of the channel run parallel to one another and are then widened towards the top so that, on the one hand, the distance between the opto-transmitter and the opto-receiver is as small as possible, and so that, on the other hand, the capillary has room between the side walls and does not touch the side walls. The output signal of the opto-receiver is amplified by an electronic circuit. Because the output signal of the opto-receiver is very weak, it is necessary to protect the electronic circuit against electrical fields for example by means of a Faraday cage.

With an alternative design type, the measuring device comprises a further component, namely a light guide arranged between the second drill hole and the opto-receiver. A conventional light guide made of plastic or glass can be used as the light guide. This design type has the advantage that the electronic circuit does not have to be positioned directly next to the measuring device.

The two coaxially arranged apertured diaphragms define a light beam the diameter of which that is effective for the measurement is constant over the entire measuring range and equal to the diameter of the apertured diaphragm or the drill holes forming it. An important advantage of the invention exists in that the measuring device manages without additional optical elements, in particular without lenses and can therefore be manufactured inexpensively. Under the diameter of the light beam that is effective for the measurement that part of the light beam is to be understood the covering of which by the capillary effects a reduction of the intensity measured by the opto-receiver.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale.

Figure 2:
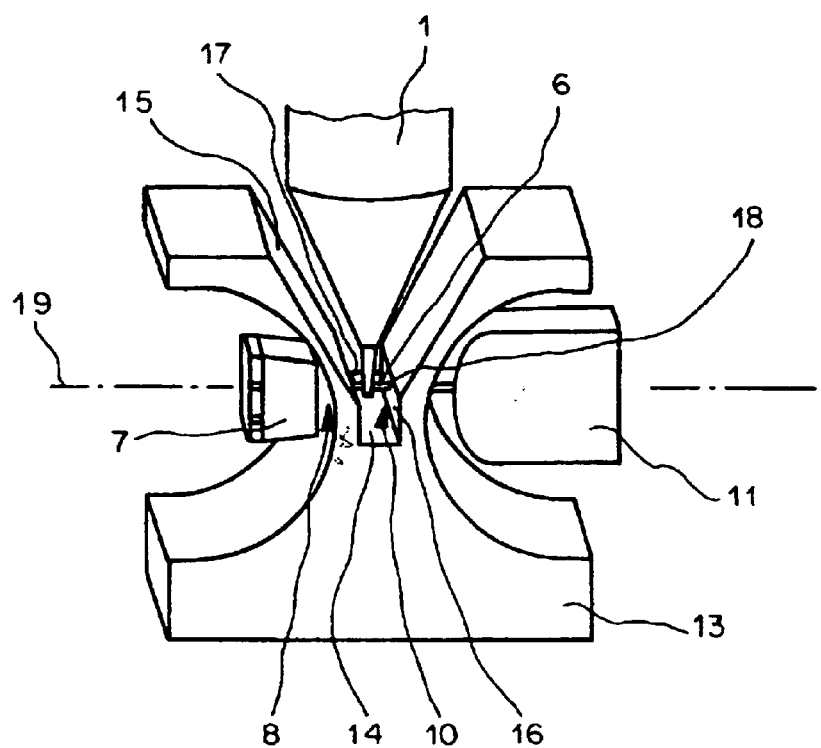
Figure 3:
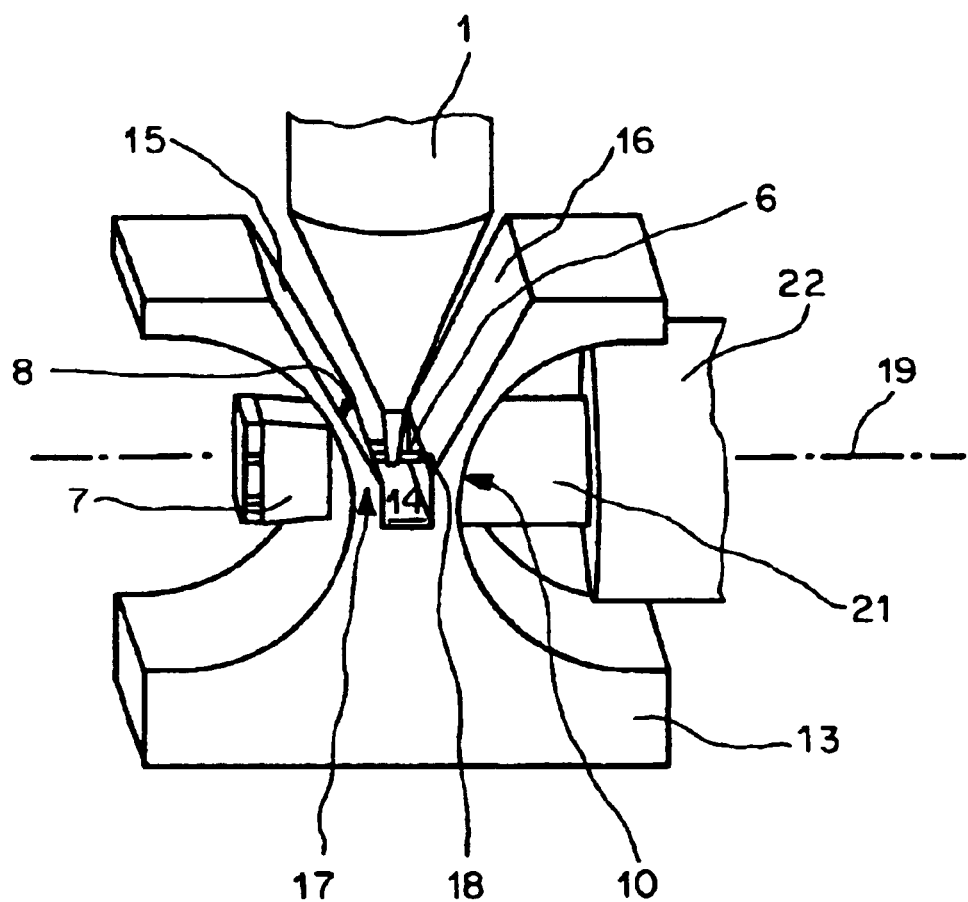

It is shown in:

FIG. 1 a measuring device for measuring the amplitude of the oscillations of the tip of a capillary, FIG. 2 a first design type of the measuring device, and FIG. 3 a second design type of the measuring device.

DETAILED DESCRIPTION OF THE PREFERRED EMBODIMENTS

FIG. 1 shows schematically a plan view of a capillary 1 that is clamped to the tip of a horn 3 to which ultrasound can be applied from an ultrasonic transducer 2 and a measuring device for measuring the amplitude of the oscillations of the tip of the capillary 1. The coordinates of a cartesian system of co-ordinates are designated x, y and z, whereby the z coordinate runs vertically to the plane of projection. The horn 3 is attached to a bondhead 4 of a Wire Bonder. The bondhead 4 enables the movement of the tip of the capillary 1 in all three coordinate directions. The measuring device comprises a light source 5 for production of a light beam 6 with a defined diameter. The light source 5 consists of a light-emitting diode 7 and a first apertured diaphragm 8 that transforms the cone of light 9 emitted by the light-emitting diode 7 into the light beam 6. The device consists further of a second apertured diaphragm 10 and an opto-receiver 11. The two apertured diaphragms 8 and 10 define the diameter of the light beam 6: The diameter of the light beam 6 that is effective for the measurement is the same as the diameter of the two apertured diaphragms 8, 10. Depending on the type of capillary, the diameter of the tip of the capillary 1 amounts to around 50_m to 150 _m. The diameter of the light beam 6 is preferably less than the diameter of the capillary 1 at the site to be measured. In the example, the diameter of the apertured diaphragms 8 and 10 and therefore of the light beam 6 amounts to around 40_m. However, the diameter of the light beam 6 can also be as large as the diameter of the capillary 1 at the site to be measured or somewhat larger, whereby then however, during the course of the measurement, no complete shading of the light beam 6 takes place. The output signal of the opto-receiver 11 is amplified by an electronic circuit 12. The electronic circuit 12 is preferably installed in a metal housing in order to protect the electronic circuit 12 from external electrical fields.

As can be seen in FIG. 1, the light beam 6 runs in x direction. The longitudinal axis 8 of the horn 3 runs in y direction. For an individual measurement of the amplitude of the oscillations of the tip of the capillary 1, in principle, the tip of the capillary 1 is positioned in the light beam 6 so that it shades part of the light beam 6. When the ultrasonic transducer 2 is switched on, the tip of the capillary 1 oscillates in xy plane. The y component $A_y$ of these oscillations causes a change in the shading of the light beam 6 which is detected by the opto-receiver 11 while the x component $A_x$ of these oscillations does not change the shading. Preferably however, no individual measurement is carried out but the method described above is applied with which the capillary 1 to which ultrasound is applied is moved from one side to the other side through the light beam 6.

FIG. 2 shows a perspective view of a first embodiment of the measuring device. The measuring device comprises the opto-transmitter, a body 13 with a channel 14 the two side walls 15 and 16 of which each contain a drill hole 17 and 18 that lie on a common axis 19, and the opto-receiver 11. This axis 19 runs transversally to the longitudinal axis of the channel 14. A conventional light-emitting diode or laser diode 7 serves as the opto-transmitter. The light emitted by the light-emitting diode 7 gets into the channel 14 through the one drill hole 17 and arrives at the opto-receiver 11 through the second drill hole 18. The two side walls 15 and 16 of the channel 14 with the drill holes 17 and 18 form the two coaxially arranged apertured diaphragms 8 and 10. The diameter of the apertured diaphragms 8 and 10 is therefore the same as the diameter of the drill holes 17 and 18. To measure the oscillation amplitude of the capillary 1, the capillary 1 is moved in longitudinal direction 20 of the channel 14 in accordance with the method described above through the light beam 6 defined by means of the two apertured diaphragms 8 and 10. In the area of the drill holes 17 and 18, the side walls 15 and 16 of the channel 14 run parallel to one another and are then widened towards the top so that, on the one hand, the distance between the light-emitting diode 7 and the opto-receiver 11 is as small as possible and so that on the other hand the capillary 1 has room between the side walls 15 and 16 and does not touch the side walls 15 and 16.

FIG. 3 shows a perspective view of a second embodiment of the measuring device. The second embodiment largely corresponds to the first embodiment but with the difference that a light guide 21 is arranged between the second apertured diaphragm 10 and the opto-receiver 11. The light guide 21 consists of a light conducting core and a sheath 22. This embodiment offers the advantage that the electronic circuit 12 (FIG. 2) can be positioned at a suitable location in the Wire Bonder where its electrical shielding is easily possible.

With all embodiments, the diameter D of the coaxial drill holes 17 and 18 in the side walls 15 and 16 and therefore of the apertured diaphragms 8 and 10 is comparable with the diameter of the tip of the capillary 1 so that the light beam 6 is covered as completely as possible during the course of the measurement. The diameter D is therefore typically less than 150 $\mu$m. The diameter D amounts for example to 100 $\mu$m, however for an extremely thin capillary 1 it can also amount to only 40 $\mu$m. Because the diameter of the light beam 6 is constant between the two apertured diaphragms 8 and 10, the result of the measurement is independent of the exact value of the x co-ordinate of the tip of the capillary.

The measuring device in accordance with the invention can either be permanently installed on the Wire Bonder or be designed as an independent measuring device that is only temporarily installed on the Wire Bonder for measurement of the oscillation amplitude of the capillary. When the oscillation direction of the capillary 1 does not coincide with the longitudinal direction of the horn 3 (FIG. 1), then the amplitude of the oscillations of the capillary 1 can be determined by means of two measurements with which the measuring device is turned 90° to one another. The component $A_x$ and the component $A_y$ of the amplitude A of the oscillations of the capillary 1 are then determined one after the other and the amplitude A is calculated from these.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Device for measuring an oscillation amplitude of a tip of a capillary, whereby the oscillations of the tip of the capillary modulate an intensity of a light beam, the device comprising
 a light source,
 an opto-receiver, and
 only two apertured diaphragms aligned coaxially to one another and arranged between the light source and the opto-receiver, wherein a diameter of the light beam that is effective for the measurement is the same as a diameter of the apertured diaphragms.

2. Device according to claim 1, wherein the apertured diaphragms are formed by means of drill holes arranged on a common axis in side walls of a channel formed in a body.

3. Device according to claim 1, wherein the diameter of the apertured diaphragms amounts to less than 100 $\mu$m.

4. Device according to claim 2, wherein the diameter of the apertured diaphragms amounts to less than 100 $\mu$m.

* * * * *